United States Patent
Sugimoto et al.

(10) Patent No.: US 6,897,607 B2
(45) Date of Patent: May 24, 2005

(54) ORGANIC ELECTROLUMINESCENT DISPLAY PANEL HAVING AN INORGANIC BARRIER FILM

(75) Inventors: Akira Sugimoto, Tsurugashima (JP); Toshiyuki Miyadera, Tsurugashima (JP); Ayako Yoshida, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/961,432

(22) Filed: Sep. 25, 2001

(65) Prior Publication Data

US 2002/0093285 A1 Jul. 18, 2002

(30) Foreign Application Priority Data

Sep. 25, 2000 (JP) ......................................... 2000-291125

(51) Int. Cl.⁷ .............................. H01J 1/62; H01J 63/04
(52) U.S. Cl. ...................... 313/506; 313/498; 313/502; 313/504; 313/506; 313/509; 313/512
(58) Field of Search .................................. 313/506, 512

(56) References Cited

U.S. PATENT DOCUMENTS

| | | | |
|---|---|---|---|
| 4,907,064 A | | 3/1990 | Yamazaki et al. |
| 5,757,126 A | * | 5/1998 | Harvey et al. ............... 313/506 |
| 5,814,935 A | | 9/1998 | Ujihara |
| 6,432,561 B1 | * | 8/2002 | Yamazaki ................... 428/690 |
| 6,537,688 B2 | * | 3/2003 | Silvernail et al. ........... 428/690 |
| 6,570,323 B1 | * | 5/2003 | Nakamata et al. .......... 313/500 |
| 6,660,409 B1 | * | 12/2003 | Komatsu et al. ............ 428/690 |

FOREIGN PATENT DOCUMENTS

| | | |
|---|---|---|
| CN | 1218577 A | 6/1999 |
| JP | 07-254486 | 10/1995 |
| JP | 09-129376 | 5/1997 |
| JP | 2000-223264 | 8/2000 |

* cited by examiner

*Primary Examiner*—Nmeshkumar D. Patel
*Assistant Examiner*—Matt Hodges
(74) *Attorney, Agent, or Firm*—Sughrue Mion, PLLC

(57) ABSTRACT

An organic electroluminescent display panel includes more than one organic electroluminescent element having a first display electrode, one or more organic functional layers including a light-emitting layer formed of an organic compound, and a second display electrode, which are sequentially layered in that order. The panel also includes a resin substrate carrying the organic electroluminescent element in contact therewith. The panel is provided with an inorganic barrier film for covering the surfaces of the resin substrate.

9 Claims, 2 Drawing Sheets

ORGANIC ELECTROLUMINESCENT DISPLAY PANEL HAVING AN INORGANIC BARRIER FILM

BACKGROUND OF THE INVENTION

1. Field of the Invention

The present invention relates to organic electroluminescent elements which include one or more thin films (hereinafter referred to as an organic functional layer) including a light-emitting layer formed of an organic compound material that exhibits electroluminescence (hereinafter referred to as the EL) for emitting light by the injection of current. More particularly, the present invention relates to an organic EL display panel having a plurality of the organic EL elements formed on a resin substrate.

2. Description of the Related Art

An organic EL element has an anodic transparent electrode, an organic functional layer, and a cathodic metal electrode, which are sequentially deposited on a transparent substrate. For example, the organic functional layer can be formed in a three-layer structure which includes a single light-emitting layer or an organic hole transport layer, a light-emitting layer, and an organic electron transport layer or in a two-layer structure which includes an organic hole transport layer and a light-emitting layer. Alternatively, the organic functional layer can be a layered body with an electron or a hole injection layer or a carrier block layer which is inserted in between suitable layers of these structures.

For example, an organic EL display panel of a matrix type or having a predetermined light-emitting pattern is conventionally known as employs a plurality of organic EL elements.

It has been suggested to employ transparent resin or plastics as the transparent substrate of the organic EL display panel. On the other hand, the organic EL display panel has a problem of developing non-light-emitting portions or so-called dark spots when exposed to the atmosphere. In particular, the interface between the cathodic layer and the organic functional layer of an organic EL element is susceptible to deterioration in property caused by moisture. When the interface is exposed to moisture in the air, a chemical reaction occurs to cause a separation between the organic functional layer and the cathode, leading to the dark spot.

When substrates or films of resin are employed for displays such as LCDs or for food packaging, deposited thereon is a barrier film acting as an effective barrier to oxygen and moisture. In particular, for a substrate of resin for use with displays, a barrier film formed of silicon oxide ($SiO_2$ or $SiO_x$ (x =1 to 2)) deposited by evaporation or sputtering is employed from the viewpoints of transparency and resistance to moisture.

Even for an organic EL element fabricated on a substrate of resin, it is necessary to provide the element with a film acting as a barrier to moisture in order to preserve the element in a good state. Conventionally, a moisture barrier film is provided between the organic EL element and the resin substrate; however, there is a problem in this structure that moisture enters the organic functional layer of the element from the surface of the resin substrate around the element.

Films such as $SiO_2$ or $SiO_x$ deposited by evaporation or sputtering do not act as an effective barrier (to moisture) enough to prevent the organic EL element from being deteriorated. In addition, it is possible to obtain a film acting as a highly effective barrier to moisture by employing a film of $SiN_x$ (where x is an atomic number ratio) deposited by sputtering. However, the film is colored and thus has bad transparency. Moreover, high stress occurs in the film leading to deflection of the substrate or cracks in the film, and thus no practical applicability has been provided by the film.

OBJECT AND SUMMARY OF THE INVENTION

It is therefore an object of the present invention to provide an organic EL element and an organic EL display panel which are resistant to deterioration in light-emitting property due to moisture.

The organic electroluminescent display panel according to the present invention includes one or more organic electroluminescent elements and a resin substrate carrying the organic electroluminescent element thereon. Each of the organic electroluminescent elements has a first display electrode, one or more organic functional layers including a light-emitting layer formed of an organic compound, and a second display electrode, all of which are deposited sequentially. The panel also has an inorganic barrier film for covering the surface of the resin substrate.

In one aspect of the organic electroluminescent display panel according to the invention, the surfaces of said resin substrate covered with said inorganic barrier film include at least a surface in contact with said organic electroluminescent element, a surface between said organic electroluminescent elements, and a surface around said organic electroluminescent element.

In another aspect of the organic electroluminescent display panel according to the invention, the surfaces of said resin substrate covered with said inorganic barrier film include a surface of a reverse side of the surface in contact with said organic electroluminescent element.

In a further aspect of the organic electroluminescent display panel according to the invention, the surfaces of said resin substrate covered with said inorganic barrier film include all surfaces thereof.

In a still further aspect of the organic electroluminescent display panel according to the invention, said inorganic barrier film is formed of silicon nitride oxide.

In another aspect of the organic electroluminescent display panel according to the invention, said inorganic barrier film is formed of silicon nitride oxide having a ratio of nitrogen to oxygen ranging from 0.13 to 2.88.

In a further aspect of the organic electroluminescent display panel according to the invention, said inorganic barrier film is deposited by sputtering.

In a still further aspect of the invention, the organic electroluminescent display panel further comprises:

a sealing film for covering said organic electroluminescent element from a rear side thereof.

In another aspect of the organic electroluminescent display panel according to the invention, said sealing film is an inorganic passivation film, and said organic electroluminescent element is entirely and hermetically covered with said inorganic barrier film and said sealing film.

DETAILED DESCRIPTION OF THE PREFERRED EMBODIMENTS

Now, embodiments of the present invention will be explained below in more detail with reference to the accompanying drawings.

Figure 1:
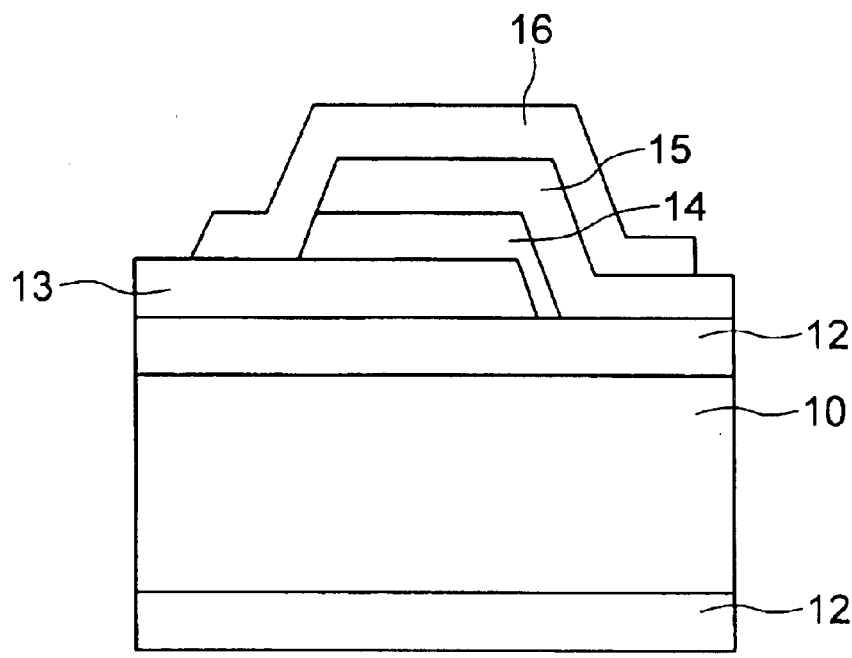
FIG. 1 is an enlarged schematic sectional view illustrating an organic EL element according to the present invention.

As shown in FIG. 1, the organic EL element according to this embodiment includes a resin substrate 10, the surface of which is covered with an inorganic barrier film 12 formed of silicon nitride oxide. Deposited sequentially on the resin substrate 10 are a first display electrode 13 (the anode of a transparent electrode), one or more organic functional layers 14 including a light-emitting layer formed of an organic compound, and a second display electrode 15 (the cathode of a metal electrode). The organic EL element has also a sealing film 16 for covering the second display electrode 15 from the rear surface thereof.

The surfaces of the resin substrate are covered with the inorganic barrier film. It is preferable that the surfaces include at least a surface in contact with the organic EL element, a surface between organic EL elements, a surface around the organic EL element, and a surface of the reverse side of the surface in contact with the organic EL element. This configuration is required to prevent the entry of moisture into the organic functional layer. Both surfaces of the resin substrate are covered with the inorganic barrier film, thereby making it possible to prevent the resin substrate from being deflected.

It is preferable that the silicon nitride oxide forming the inorganic barrier film has a ratio of nitrogen to oxygen ranging from 0.13 to 2.88. Ratios exceeding the foregoing range would cause the residual stress of the film to increase, whereas ratios below the foregoing range would make it impossible to sufficiently prevent the entry of moisture into the organic functional layer.

For example, each organic EL element is provided with the transparent electrode (the first display electrode) 13 of indium tin oxide (ITO) deposited on the transparent resin substrate 10 by evaporation or sputtering. Deposited sequentially by evaporation on top thereof are a hole injection layer of copper phthalocyanine, a hole transport layer of TPD (triphenylamine derivative), a light-emitting layer of Alq3 (aluminum chelate complex), and an electron injection layer of Li2O (lithium oxide), thereby forming the organic functional layer 14. Further deposited by evaporation on top thereof is the metal electrode 15 of Al (the second display electrode) to be opposite to the electrode pattern of the first display electrode 13.

To obtain a highly effective barrier film to moisture, films of $SiO_2$, $SiO_x$, and $SiN_x$ were deposited by sputtering. This experiment has shown that silicon nitride oxide is preferred as the inorganic barrier film, and the service conditions thereof were discussed.

Several samples of resin substrates for use with the organic EL element were prepared. First, the resin substrate 10, formed of the base material of polycarbonate (PC), for use with commercially available plastic liquid crystal was coated with a resin layer and smoothed. Then, a moisture barrier film 12 was deposited on both sides of the resin substrate 10 under the conditions as shown in Table 1.

TABLE 1

| Sample | Composition of moisture barrier film | Thickness | Deposition rate | Deposition temperature | Ratio of oxygen to Nitrogen (atomic number ratio) |
|---|---|---|---|---|---|
| A | $SiN_x$ | 2000 Å | 100Å/min | 100° C. | 0:1 |
| B | $SiO_xN_y$ | 2000 Å | 120Å/min | 100° C. | 1:1.4 |
| C | $SiO_xN_y$ | 2000 Å | 140Å/min | 100° C. | 1:0.55 |
| D | $SiO_2$ | 2000 Å | 90Å/min | 100° C. | 1:0 |

(x: atomic number)(y: atomic number)

The SiNx moisture barrier film of sample A yielded a high stress and caused cracks in the film, thereby making it impossible to form an organic EL element on the resin substrate. The transparent electrode 13 was deposited and patterned on each of the resin substrates on which samples B to D were deposited, respectively. Furthermore, the organic functional layer 14 and the metal electrode 15 were deposited to form an organic EL element. Thereafter, except for a lead electrode of the organic EL element, all portions thereof were sealingly covered with the silicon nitride film 16 or an inorganic passivation film deposited by the plasma CVD (Chemical Vapor Deposition) method.

The organic EL elements prepared as described above were driven to emit light and observed from the direction of output light. These organic EL elements were kept at 60° C. for 260 hours at 95% relative humidity, and then observed again to check the state of light emission.

No change was observed in light emission of samples B and C having an $SiO_xN_y$ moisture barrier film deposited thereon. However, sample D having a $SiO_2$ moisture barrier film deposited thereon emitted no light near the edge of the transparent electrode. Thus, it was confirmed that the moisture barrier film of silicon nitride oxide is preferred.

Furthermore, a preferred combination of the moisture barrier film of silicon nitride oxide and the resin substrate was discussed.

On the entire surface of the resin substrate 10, formed of PC (polycarbonate), for use with plastic crystal liquid, 2000 Angstrom of silicon nitride oxide ($SiO_xN_y$) was deposited as the moisture barrier film 12 at each of the mixture ratios of oxygen to nitrogen as shown in Table 2. Then, the transmittance of each $SiO_xN_y$ film was measured in the visible light band. The results of measurements are shown in Table 2.

TABLE 2

| Sample | Nitrogen/Oxygen (ratio of atomic number) |
|---|---|
| E | 8.50 |
| F | 2.88 |
| G | 1.37 |
| H | 0.55 |
| I | 0.24 |
| J | 0.13 |
| K | 0.05 |

TABLE 3

| Sample | Transmittance |
| --- | --- |
| E | 58.0 |
| F | 67.7 |
| G | 92.1 |
| H | 95.1 |
| I | 96.6 |
| J | 97.2 |
| K | 98.2 |

Sample E yielded a high stress in the barrier film of silicon nitride oxide to cause cracks in the film, thereby making it impossible to form an organic EL element on the resin substrate.

For samples F to K, the transparent electrode 13 was each deposited and patterned on the resin substrate. Then, the organic functional layer 14 and the metal electrode 15 were sequentially deposited to form organic EL elements. Thereafter, except for the lead electrode of the organic EL elements, all portions thereof were sealingly covered with the silicon nitride film 16 deposited by plasma CVD.

The organic EL elements prepared as described above were driven to emit light and observed from the direction of output light. These organic EL elements were baked at 60° C. for 260 hours at 95% relative humidity and then observed again to check the state of light emission.

Almost no change was observed in light emission of samples F to J having a moisture barrier film deposited there on. However, sample K having a moisture barrier film deposited thereon emitted no light near the edge of the transparent electrode.

This showed the following fact in forming an organic EL element on a resin substrate. That is, silicon nitride oxide films having mixture ratios of nitrogen to oxygen ranging from 0.13 to 2.88 (ratio of nitrogen to oxygen) can be employed as a moisture barrier film, thereby making it possible to provide the organic EL element with transparency and a high preservability as well.

The present invention has employed a film formed of silicon nitride oxide as a moisture barrier film that is essential for the improvement of preservability of an organic EL element prepared on a resin substrate. This makes it possible to provide the organic EL element with a resin substrate having a sufficiently effective resistance to moisture.

Furthermore, the moisture barrier film provides for stress and transparency performance sufficiently enough to be applied for a display, thereby making it possible to realize a flexible organic EL display which employs a resin substrate, and is thin in thickness and light in weight.

Figure 2:
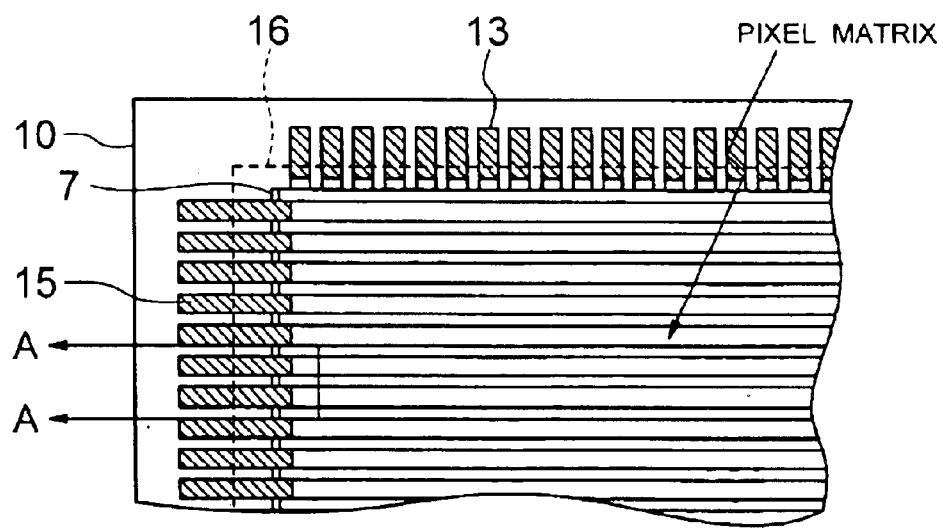
FIG. 2 is an enlarged schematic partial rear view illustrating an organic EL display panel according to the present invention.

FIG. 2 is an enlarged partial rear view illustrating an organic EL display panel including a plurality of organic EL elements according to another embodiment. As shown in FIG. 2, the organic EL display panel includes a plurality of organic EL elements disposed in a matrix on the PC resin substrate 10, the entirety of which is covered with a film formed of silicon nitride oxide. On top of the film of silicon nitride oxide, sequentially layered are a row electrode 13 (the first anodic display electrode) including a transparent electrode layer, an organic functional layer, and a column electrode 15 (the second display electrode) including a metal electrode layer intersecting the row electrode. Each row electrode is formed in the shape of a stripe and disposed parallel to another at predetermined intervals and the column electrode is formed and disposed in the same manner as well. As described above, a display panel of a matrix type has an image display matrix made up of a plurality of organic EL elements formed at the intersections of a plurality of row and column electrodes. The first display electrode 13 can be made up of a metal bus line for electrically connecting island-shaped transparent electrodes in the horizontal direction. The organic EL display panel includes a plurality of barrier ribs 7 provided between organic EL elements on the film of silicon nitride oxide on the resin substrate 10. The sealing film 16 is formed on top of the second display electrode 15 and the barrier rib 7. It is also possible to select and deposit an organic functional layer material as appropriate to form light-emitting portions such as red R, green G, and blue B portions.

Figure 3:
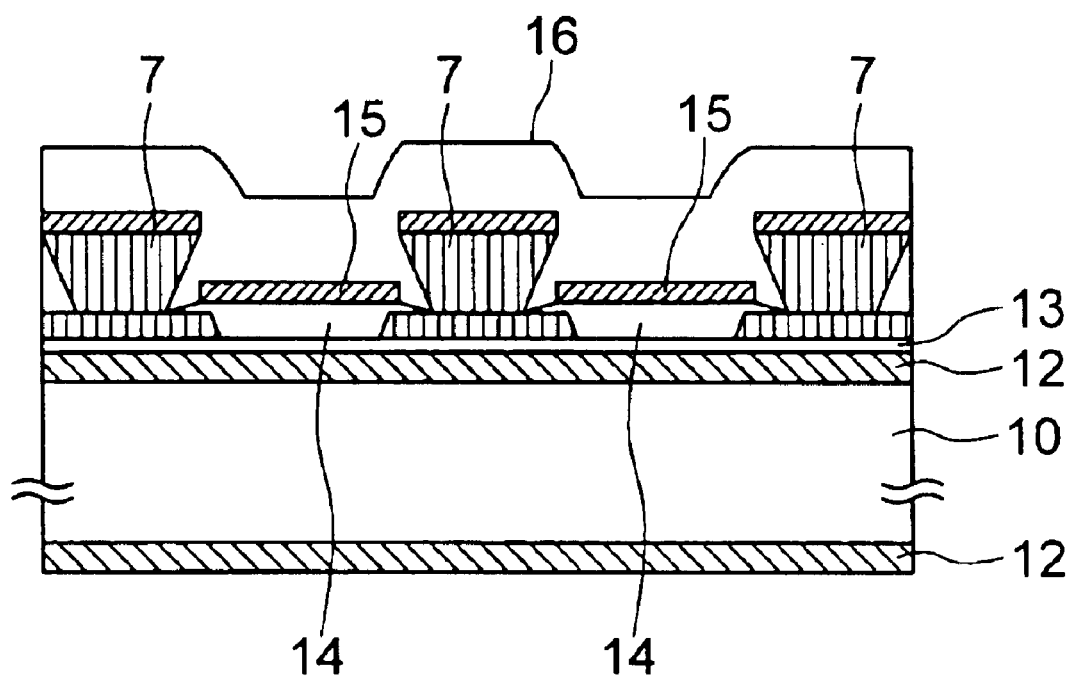
FIG. 3 is a schematic partial sectional view illustrating an organic EL display panel taken along line A—A of FIG. 2.

As shown in FIG. 3, each of the organic EL elements of the panel includes the first display electrode 13, one or more organic functional layers 14 including a light-emitting layer formed of an organic compound, and the second display electrode 15, all of which are sequentially layered on the resin substrate 10. The barrier rib 7 is so provided between organic EL elements as to protrude from the resin substrate.

Furthermore, the organic EL display panel may include an inorganic passivation film as part of the sealing film 16 for covering the organic EL element and the barrier rib 7 from the rear side thereof. As a barrier to moisture, a sealing film formed of resin can be provided on the inorganic passivation film. It is also possible to provide another inorganic passivation film formed of an inorganic substance on the outermost surface of the sealing film of resin. The inorganic passivation film is formed of nitride such as the aforementioned silicon nitride oxide and silicon nitride or an inorganic substance such as oxide and carbon. As the resin for forming the sealing film, employed are fluorine-based resin, silicon-based resin, or synthetic resin such as photo-resist or polyimide.

The organic EL display panels having this sealing structure were kept for 260 hours at the room temperature and at a high relative humidity in the presence of heat (60° C., 95%), respectively. After the keeping, it was found that no cracks and peeling occurred in the sealing structure and the organic EL display panel still provided a stable light-emitting operation.

As described above, the inorganic barrier film covering the substrate prevents the entry of moisture from the side of the resin substrate of the organic EL element.

In the aforementioned embodiments, the sputtering method was employed to deposit the inorganic barrier film for preventing the entry of moisture; however, the present invention is not limited thereto, and applicable as well is the vapor phase epitaxial method such as the plasma CVD method or the vacuum evaporation method.

Furthermore, in the aforementioned embodiment, as shown in FIG. 2, such an organic EL display panel of a passive matrix display type has been described which includes the organic functional layer 14 or light-emitting portions disposed at the intersections of a plurality of transparent electrodes 13 on the transparent resin substrate 10 and the metal electrodes 15. However, according to the present invention, the inorganic barrier film is also applicable to the substrate of panels of an active matrix display type.

The present invention provides a sealing structure enough to prevent the entry of moisture or oxygen, thereby making it possible to provide a highly reliable organic EL element and a highly reliable organic EL display.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on Japanese Patent Application No. 2000-291125 which is hereby incorporated by reference.

What is claimed is:

1. An organic electroluminescent display panel comprising:
   one or more organic electroluminescent elements each having a first display electrode, one or more organic functional layers including a light-emitting layer formed of an organic compound, and a second display electrode, sequentially layered; and
   a resin substrate having surfaces and carrying said organic electroluminescent element in contact therewith;
   wherein that said organic electroluminescent display panel is provided with an organic barrier film for covering the surfaces of said resin substrate,
   wherein said inorganic barrier film is formed of silicon nitride oxide having a ratio of nitrogen to oxygen ranging from 0.13 to 2.88.

2. An organic electroluminescent display panel according to claim 1, wherein
   the surface of said resin substrate covered with said inorganic barrier film include at least a surface in contact with said organic electroluminescent element, a surface between said organic element electroluminescent elements, and surface around said organic electroluminescent element.

3. An organic electroluminescent display panel according to claim 1, wherein
   the surfaces of said resin substrate covered with said inorganic barrier film include a surface of a reverse side of the surface in contact with said organic electroluminescent element.

4. An organic electroluminescent display panel according to claim 1, wherein
   the surfaces of said resin substrate covered with said inorganic barrier film include all surfaces thereof.

5. An organic electroluminescent display panel according to claim 1, wherein
   said inorganic barrier film is deposited by sputtering.

6. An organic electroluminescent display panel according to claim 1, further comprising
   a sealing film for covering said organic electroluminescent element from a rear side thereof.

7. An organic electroluminescent display panel according to claim 6, wherein
   said sealing film is an inorganic passivation film, and said organic electroluminescent element is entirely and hermetically covered with said inorganic barrier film and said sealing film.

8. An organic electroluminescent display panel comprising:
   at least one organic electroluminescent element comprising a first display electrode, a light-emitting layer formed of an organic compound, and a second display electrode, sequentially layered;
   a resin substrate carrying said at least one organic electroluminescent element; and
   an inorganic barrier film which covers at least one surface of said resin substate,
   wherein said inorganic barrier film is formed of silicon nitride oxide having a ratio of nitrogen to oxygen ranging from 0.13 to 2.88.

9. An organic electroluminescent display panel comprising:
   at least one organic electroluminescent element comprising a first display electrode, a light-emitting layer formed of an organic compound, and a second display electrode, sequentially layered;
   a resin substrate carrying said at least one organic electroluminescent element; and
   an inorganic barrier film which covers at least one surface of said resin substrate,
   wherein said inorganic barrier film is formed of silicon nitride oxide having a ratio of nitrogen to oxygen ranging from 0.13 to 2.88,
   wherein said inorganic barrier film covers two opposing surfaces of said resin substrate.

* * * * *

UNITED STATES PATENT AND TRADEMARK OFFICE
CERTIFICATE OF CORRECTION

PATENT NO. : 6,897,607 B2  Page 1 of 1
DATED : May 24, 2005
INVENTOR(S) : Akira Sugimoto et al.

It is certified that error appears in the above-identified patent and that said Letters Patent is hereby corrected as shown below:

<u>Column 7,</u>
Line 26, please delete "organic" and insert -- inorganic --.

Signed and Sealed this

Twenty-third Day of August, 2005

JON W. DUDAS
*Director of the United States Patent and Trademark Office*